US009885493B2

United States Patent
Sriraman et al.

(10) Patent No.: US 9,885,493 B2
(45) Date of Patent: Feb. 6, 2018

(54) AIR COOLED FARADAY SHIELD AND METHODS FOR USING THE SAME

(71) Applicant: Lam Research Corporation, Fremont, CA (US)

(72) Inventors: Saravanapriyan Sriraman, Fremont, CA (US); John Drewery, Santa Clara, CA (US); Jon McChesney, Sacramento, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1017 days.

(21) Appl. No.: 13/974,324

(22) Filed: Aug. 23, 2013

(65) Prior Publication Data

US 2015/0020969 A1    Jan. 22, 2015

Related U.S. Application Data

(60) Provisional application No. 61/847,407, filed on Jul. 17, 2013.

(51) Int. Cl.
C23C 16/00       (2006.01)
H01L 21/306     (2006.01)
(Continued)

(52) U.S. Cl.
CPC ............ *F24F 13/00* (2013.01); *H01J 37/321* (2013.01); *H01J 37/32522* (2013.01); *H01J 37/32651* (2013.01); *H01J 37/32963* (2013.01)

(58) Field of Classification Search
CPC .................. H01J 37/321; H01J 37/3211; H01J 37/32119; H01J 37/32128;
(Continued)

(56) References Cited

U.S. PATENT DOCUMENTS 4,633,812 A    1/1987  Fujiyama
4,918,031 A    4/1990  Flamm et al.
(Continued)

FOREIGN PATENT DOCUMENTS

CN    101777391 A    7/2010    ............... G21B 1/11
CN    202616187 U    12/2012   ............... H01J 37/32
(Continued)

OTHER PUBLICATIONS

Singapore Search Report, 201307543-7, pp. 1-8, dated May 13, 2014.
(Continued)

*Primary Examiner* — Luz Alejandro Mulero
(74) *Attorney, Agent, or Firm* — Martine Penilla Group, LLP

(57) ABSTRACT

A processing chamber and a Faraday shield system for use in a plasma processing chambers are provided. One system includes a disk structure defining a Faraday shield, and the disk structure has a process side and a back side. The disk structure extends between a center region to a periphery region. The disk structure resides within the processing volume. The system also includes a hub having an internal plenum for passing a flow of air received from an input conduit and removing the flow of air from an output conduit. The hub has an interface surface that is coupled to the back side of the disk structure at the center region. A fluid delivery control is coupled to the input conduit of the hub. The fluid delivery control is configured with a flow rate regulator. The regulated air can be amplified or compressed dry air (CDA).

21 Claims, 9 Drawing Sheets

(51) Int. Cl.
*F24F 13/00* (2006.01)
*H01J 37/32* (2006.01)

(58) Field of Classification Search
CPC ........... H01J 37/32137; H01J 37/32146; H01J 37/32155; H01J 37/32165; H01J 37/32174; H01J 37/32183; H01J 37/32917; H01J 37/32926; H01J 37/32935; H01J 37/32944; H01J 37/32954; H01J 37/32963; H01J 37/32972; H01J 37/32981; H01J 37/3299
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 5,525,159 | A | 6/1996 | Hama et al. |
| 5,540,800 | A | 7/1996 | Qian |
| 5,622,635 | A | 4/1997 | Cuomo et al. |
| 6,245,202 | B1 * | 6/2001 | Edamura .............. C23C 16/507 118/723 AN |
| 6,250,563 | B1 | 6/2001 | Frank et al. |
| 6,280,563 | B1 | 8/2001 | Baldwin, Jr. et al. |
| 6,326,597 | B1 * | 12/2001 | Lubomirsky ..... H01L 21/67248 118/723 R |
| 6,367,412 | B1 | 4/2002 | Ramaswamy et al. |
| 6,390,019 | B1 * | 5/2002 | Grimbergen .......... H01J 37/321 118/712 |
| 6,422,173 | B1 | 7/2002 | Nakajima |
| 6,447,636 | B1 | 9/2002 | Qian et al. ................ 156/345.48 |
| 6,474,258 | B2 | 11/2002 | Brcka ........................ 118/723 I |
| 6,503,364 | B1 | 1/2003 | Masuda et al. |
| 6,523,493 | B1 | 2/2003 | Brcka ........................ 118/723 I |
| 6,531,030 | B1 | 3/2003 | Nakajima |
| 6,666,982 | B2 | 12/2003 | Brcka |
| 7,223,321 | B1 | 5/2007 | Comendant et al. |
| 7,413,673 | B2 | 8/2008 | Lohokare et al. |
| 7,959,984 | B2 | 6/2011 | Lohokare et al. ............ 427/569 |
| 8,683,943 | B2 | 4/2014 | Onodera et al. .......... 118/723 E |
| 2001/0022158 | A1 | 9/2001 | Brcka ........................ 118/723 I |
| 2003/0062840 | A1 * | 4/2003 | Moroz .............. H01J 37/32091 315/111.51 |
| 2003/0075349 | A1 | 4/2003 | Kruse et al. |
| 2004/0163595 | A1 | 8/2004 | Edamura et al. .......... 118/723 I |
| 2004/0194890 | A1 | 10/2004 | Moroz |
| 2005/0103444 | A1 | 5/2005 | Brcka |
| 2005/0103445 | A1 | 5/2005 | Brcka |
| 2005/0189069 | A1 * | 9/2005 | Ludviksson ...... H01J 37/32477 156/345.24 |
| 2005/0233479 | A1 | 10/2005 | Chang ............................. 438/14 |
| 2006/0130758 | A1 | 6/2006 | Lohokare et al. ............ 118/715 |
| 2006/0169669 | A1 | 8/2006 | Zojaji et al. ..................... 216/58 |
| 2007/0113981 | A1 | 5/2007 | Brcka |
| 2007/0181257 | A1 | 8/2007 | Comendant et al. .... 156/345.48 |
| 2007/0238199 | A1 | 10/2007 | Yamashita ........................ 438/5 |
| 2008/0135518 | A1 | 6/2008 | Chen et al. ...................... 216/67 |
| 2010/0101728 | A1 * | 4/2010 | Iwasaki ............. H01J 37/32192 156/345.33 |
| 2010/0278999 | A1 | 11/2010 | Onodera et al. .................. 427/8 |
| 2011/0204023 | A1 | 8/2011 | Huh et al. ........................ 216/37 |
| 2011/0297320 | A1 | 12/2011 | Sakka et al. ............. 156/345.48 |
| 2012/0273130 | A1 | 11/2012 | Drewery et al. ........... 156/345.3 |
| 2014/0150882 | A1 | 6/2014 | Onodera et al. ................. 137/2 |

FOREIGN PATENT DOCUMENTS

| | | | | |
|---|---|---|---|---|
| EP | 0 801 413 | A1 | 10/1997 | |
| JP | 2010176078 | A | 8/2010 | ........... G02F 1/1333 |
| TW | 340295 | | 9/1998 | ............... H05H 1/00 |
| TW | 200635446 | A | 10/2006 | ............... H05H 1/24 |

OTHER PUBLICATIONS

PCT International Search Report and Written Opinion of the International Searching Authority (ISA) issued in International Application No. PCT/US2012/034837, ISA/US Commissioner for Patents, dated Apr. 24, 2012.

Mahoney et al., Electron-density and energy distributions in a planar inductively.

Taiwan Search Report, 102138117, p. 5 from Examination Opinions, dated Nov. 10, 2014.

* cited by examiner

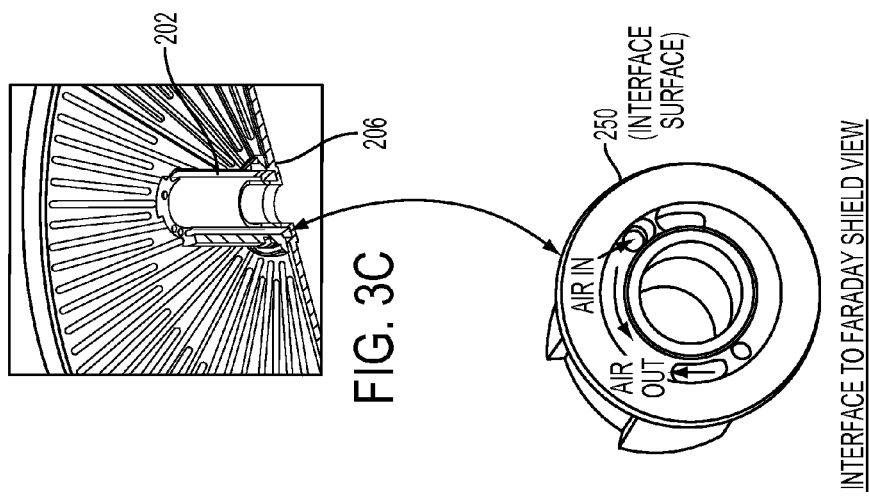
FIG. 3C
FIG. 3D
INTERFACE TO FARADAY SHIELD VIEW
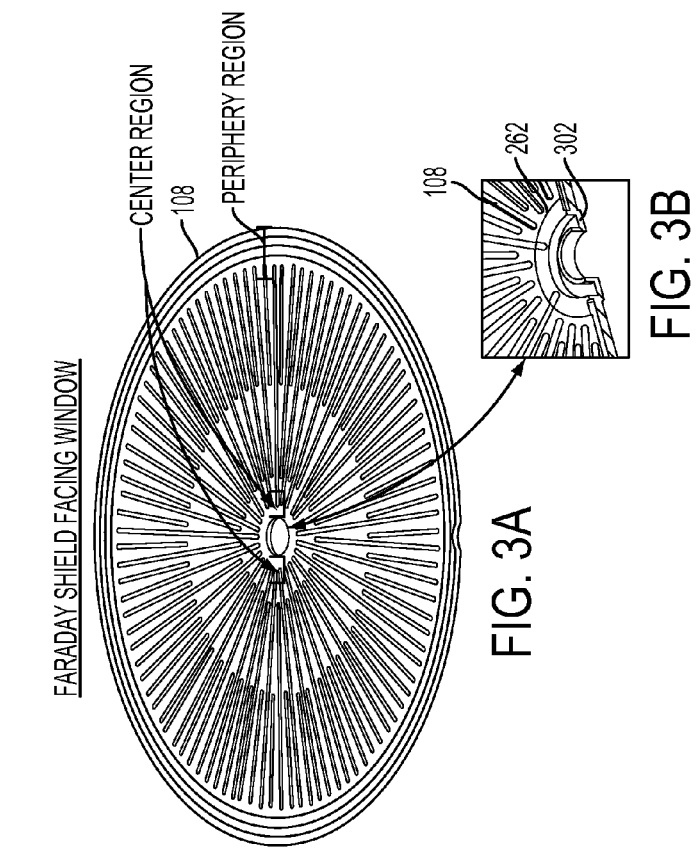
FIG. 3A
FARADAY SHIELD FACING WINDOW
FIG. 3B

AIR COOLED FARADAY SHIELD AND METHODS FOR USING THE SAME

CLAIM OF PRIORITY

This application claims the benefit of and priority to, under 35 U.S.C. 119 §(e), to U.S. Provisional Patent Application No. 61/847,407, filed on Jul. 17, 2013, and titled "Air Cooled Faraday Shield and Methods for Using the Same", which is hereby incorporated by reference in its entirety.

1. Field of the Invention

The present invention relates generally to semiconductor fabrication, and more particularly, to a chamber containing a Faraday shield used in plasma etching apparatus.

2. Description of the Related Art

In semiconductor manufacturing, etching processes are commonly and repeatedly carried out. As is well known to those skilled in the art, there are two types of etching processes: wet etching and dry etching. One type of dry etching is plasma etching performed using an inductively coupled plasma etching apparatus, such as transformer coupled plasma (TCP) chambers.

A plasma contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

The reaction products generated by the etching process may be volatile or non-volatile. The volatile reaction products are discarded along with used reactant gas through the gas exhaust port. The non-volatile reaction products, however, typically remain in the etching chamber. The non-volatile reaction products may adhere to the chamber walls and a dielectric window. Adherence of non-volatile reaction products to the window may interfere with the etching process. Excessive deposition may result in particles flaking off the window onto the wafer, thus interfering with the etching process. In some embodiments, a Faraday shield is utilized inside the chamber, such that the Faraday shield blocks deposition onto the window. In such cases, the deposition will then build up on the Faraday shield, which can also lead to particles flaking off or peeling off over time. Coatings of the Faraday shield itself can also peel off if excessive temperatures are applied to the Faraday shield for extended periods of time.

In TCP chambers, power, which heats the chamber and associated parts, is primarily delivered via TCP coils, which resided over the window. During etch processes, a chamber and its parts may cycle through various steps, causing heat from the processes to similarly cycle level e.g., from hot to very hot, or cold to hot, hot to cold, etc. When the Faraday shield receives such deposition, the temperature cycling itself may lead to such flaking or pealing of the deposition material. Currently, to address this issue, chambers are required to be cleaned frequently or when it is determined that deposition (e.g., etch byproducts) residing in the Faraday shield may flake off or peel, and ultimately land on wafers being processed.

It is in this context that embodiments of the inventions arise.

SUMMARY

Plasma processing chambers utilize radio frequency (RF) power to generate the plasma in the chamber. The RF power is typically introduced via a dielectric (ceramic or quartz window) and can also be coupled through coated (e.g., anodized) Faraday shields (e.g., grounded metal or floating dielectric), which are immersed in the plasma environment. RF induced heating increases the temperatures of the Faraday shield during plasma processing and can severely increase the Faraday shield temperature beyond a threshold above which anodized coating or deposited plasma byproducts start to flake and/or peel off, which may produce particles and defect issues on wafer. The embodiments defined herein provide methods and structures for controlling and/or maintaining the temperature of the Faraday shield for successful operation and minimize thermal cycling issues.

In one embodiment, flowing air via elevated rates or preset rates to a hub that interfaces with a Faraday shield can assist in reducing the temperature of the Faraday shield near the center region. This provides a method and system of controlling the temperature of the Faraday shield and reducing the wide cycle swings in temperature during operation.

In one embodiment, compressed dry air (CDA) provides a way of cooling the Faraday shield with the aid of an air-path directing plenum that channels the air into a central hub that removes the excess heat and moves it out into the TCP coil enclosure. In one embodiment, compressed dry air (CDA) equivalent to 10 cubic feet per minute (CFM) flows or higher and at high inlet pressures in the range of 10-20 pounds per square inch (PSI) enable super convective flows in narrow air plenums. Other example parameters are described below.

In one example, the plenums are attached to a central air-delivery hub that supports one or multiple streams of air inlet and outlets for optimal mixing and heat removal from the Faraday shield's internal contact face and reduces the operating temperature of the shield and minimizes thermal cycling issues.

In another embodiment, instead of CDA, it is possible to use air with air-amplifiers for enhanced flow or liquid based cooling. In addition, air amplifiers may also be adapted to a variety of air-channeling plenum designs that optimize the air pathway and generate uniform temperature distribution and provide a wide range of window cooling options for internal Faraday shields and/or components in RF or plasma environments.

In one embodiment, a Faraday shield system for use in a plasma processing chambers is provided. The system includes a disk structure defining a Faraday shield, and the disk structure has a process side and a back side. The disk structure extends between a center region to a periphery region. The disk structure resides within the processing volume. The system also includes a hub having an internal plenum for passing a flow of air received from an input conduit and removing the flow of air from an output conduit. The hub has an interface surface that is coupled to the back side of the disk structure at the center region. A fluid delivery control is coupled to the input conduit of the hub. The fluid delivery control is configured with a flow rate regulator. The regulated air can be amplified or compressed dry air (CDA). The system includes a fluid removal control coupled to the output conduit for removing the flow of air from the plenum of the hub. The plenum of the hub defines a loop into and out of the hub, and that the flow of air is isolated from the processing volume. A controller is provided for managing the flow rate regulator that sets the flow rate of the flow of air.

In another embodiment, a plasma processing apparatus is disclosed. The apparatus includes a chamber having walls and a substrate support defined in a processing volume, and a Faraday shield. The Faraday shield has a disk shape with a process side and a back side, and the disk shape extends between a center region to a periphery region. The Faraday shield is defined within the processing volume, such that the process side faces the substrate support. The apparatus includes a hub having an internal plenum for passing a flow of fluid received from an input conduit and removing the flow of fluid from an output conduit. The hub has an interface surface that is thermally coupled to the back side of the Faraday shield at the center region. A fluid delivery control is coupled to the input conduit of the hub, the fluid delivery control is configured with a flow rate regulator for setting a flow rate of the flow of fluid through the plenum of the hub. A fluid removal control is coupled to the output conduit for removing the flow of fluid from the plenum of the hub.

In still another embodiment, a method for controlling a temperature of a Faraday shield disposed inside a process volume of a plasma processing chamber is disclosed. The method includes thermally coupling a hub to a back side of the Faraday shield at a center region of the Faraday shield. The hub has a plenum for receiving air and removing air, such that air communicates through the plenum. The method includes supplying a flow of air into a plenum to the hub. The flow of air into and out of the plenum is maintained outside of the process volume. The method also includes regulating a flow rate of the air into the plenum. The regulating is configured to manage adjustments temperature of the hub at the thermal couple to the center region of the Faraday shield. The regulating is correlated to processing steps performed in the process volume. In one embodiment, increases in flow rate of the air reduce a temperature of the center region of the of the Faraday shield causing heat conductance through the Faraday shield toward the center region.

BRIEF DESCRIPTION OF THE DRAWINGS

The invention, together with further advantages thereof, may best be understood by reference to the following description taken in conjunction with the accompanying drawings.

FIGS. 3A-3D illustrate other alternate hub constructions, interfaces, plenums and modifications to the center region of the Faraday shield, in accordance with one embodiment of the present invention.

FIGS. 5A-1 and 5A-2 illustrate example temperature variations of the dielectric window (when in contact with the hub or placed proximate to the hub), and the associated changes based on changes in flow rates of air, in accordance with one embodiment of the present invention.

FIGS. 5B-1 and 5B-2 illustrate example temperature variations of the Faraday shield and associated based on changes in flow rates of air, in accordance with one embodiment of the present invention.

DETAILED DESCRIPTION

Figure 1:
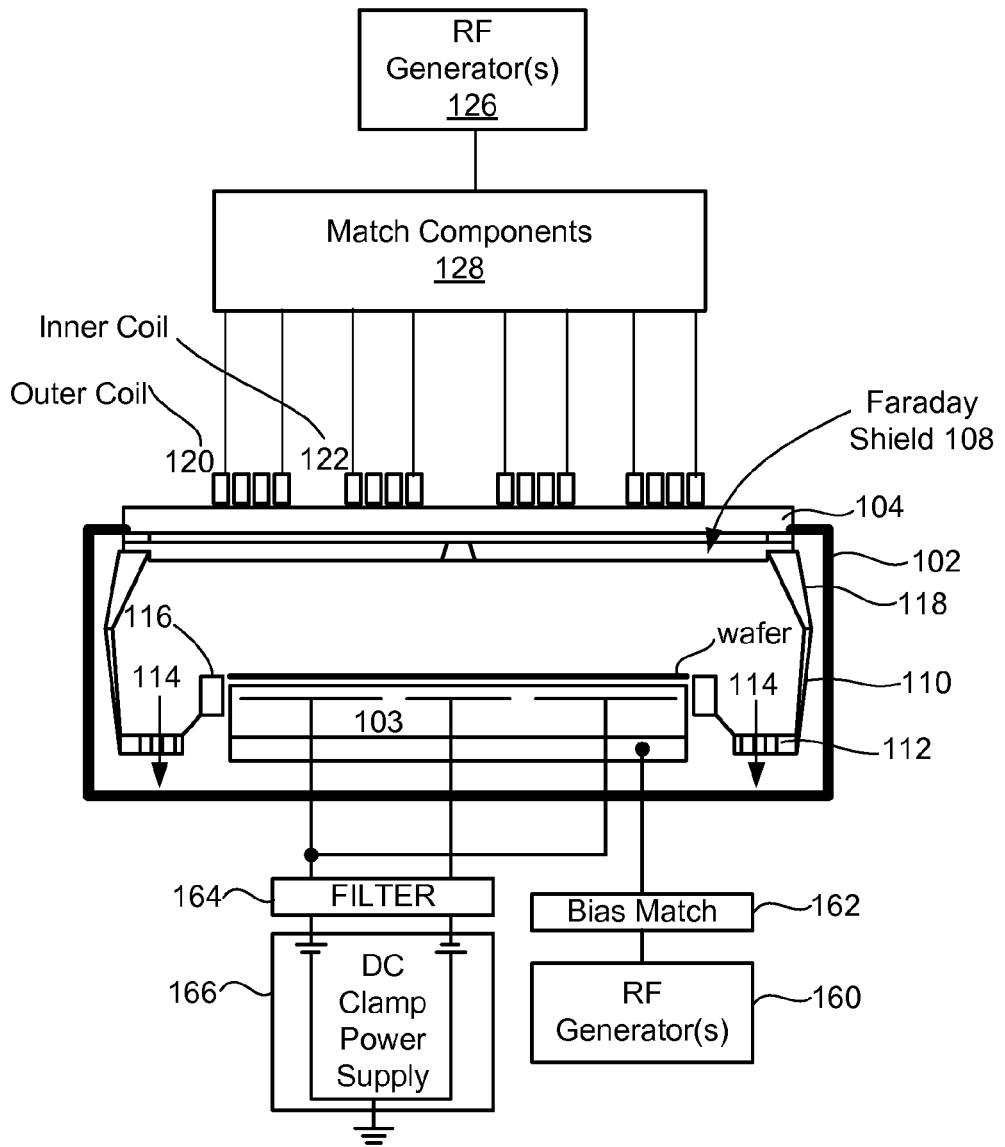
FIG. 1 illustrates a plasma processing system utilized for etching operations, in accordance with one embodiment of the present invention.

Disclosed are apparatus used in etching semiconductor substrates and layers formed thereon during the manufacture of semiconductor devices. The apparatus is defined by a chamber in which etching is performed. A Faraday shield is disposed within the chamber. A hub is configured to interface with the Faraday shield, such that the contact provides a thermal interface. The hub is connected to a plurality of conduits that deliver fluid and remove fluid from the hub, such that the fluid is delivered at a rate of increased flow through the hub. The plurality of conduits connect to a plenum inside of the hub, such that the fluid enters the hub and leaves the hub.

In one embodiment, the hub is a separate structure that couples and interfaces thermally with the Faraday shield (and optionally also with the window) or is a structure that is integrated with the Faraday shield.

The fluid, in one embodiment, is air. The air, in one embodiment, is compressed dry air (CDA). By flowing air to and from the hub, which is thermally connected to the Faraday shield, a temperature of the Faraday shield at the location of the interface is caused to decrease, relative to an increased temperature of the Faraday shield during operation of the chamber. In one embodiment, the air is flown through a plenum of the hub at a set flow rate that is pre-computed, selected or regulated to reduce a temperature of the Faraday shield and/or the dielectric window.

For example, during operation of the chamber, a TCP coil provides power to the chamber, so as to define a plasma within the chamber. The TCP coil is disposed above a dielectric window and the Faraday shield is disposed below and adjacent to the dielectric window. In this configuration, the TCP coil will heat up the window and the Faraday shield. During processing cycles, the heat will fluctuate up and down, causing the aforementioned heat differentials.

Therefore, by flowing air to and from the hub (i.e., through), which is in thermal contact with at least a center region of the Faraday shield, the temperature of the Faraday shield at and around the vicinity of the center region is caused to be reduced. The reduced temperature in and around the center region of the Faraday shield will cause a temperature differential along the Faraday shield, such that heat will conduct along the Faraday shield (i.e., in the bulk body of the Faraday shield) from hot to cold (e.g., toward the hub). In one embodiment, conducting from hot to cold means that the hotter surfaces of the Faraday shield which are away from the center region (e.g., the periphery and between the periphery and center of the Faraday shield) will decrease in temperature as heat conducts toward the cooler center region of the Faraday shield.

It will be apparent to one skilled in the art that the present invention may be practiced without some of these specific details. In other instances, well known process operations and implementation details have not been described in detail in order to avoid unnecessarily obscuring the invention.

FIG. 1 illustrates a plasma processing system utilized for etching operations, in accordance with one embodiment of the present invention. The system includes a chamber 102 that includes a chuck 103, a dielectric window 104, and a Faraday shield 108. The chuck 103 can be an electrostatic chuck for supporting the substrate when present. Also shown is an edge ring 116 that surrounds chuck 103, and has an upper surface that is approximately planar with a top surface of a wafer, when present over chuck 103. Chamber 102 also includes a lower liner 110 that is coupled to an upper liner 118, also referred to as a pinnacle. The upper liner 118 is configured to support the Faraday shield 108. In one embodiment, the upper liner 118 is coupled to ground and therefore provides ground to the Faraday shield 108. A space is provided between the Faraday shield 108 and the dielectric window 106. Excess gases 114 are removed from the process volume of the chamber via exhaust plate 112.

Further shown is an RF generator 160, which can be defined from one or more generators. If multiple generators are provided, different frequencies can be used to achieve various tuning characteristics. A bias match 162 is coupled between the RF generators 160 and a conductive plate of the assembly that defines the chuck 103. The chuck 103 also includes electrostatic electrodes to enable the chucking and dechucking of the wafer. Broadly, a filter 164 and a DC clamp power supply is provided. Other control systems for lifting the wafer off of the chuck 103 can also be provided. Although not shown, pumps are connected to the chamber 102 to enable vacuum control and removal of gaseous byproducts from the chamber during operational plasma processing.

The Faraday shield has a central region that will allow a showerhead to deliver process gases into the processing volume of the chamber 102. Additionally, other probing apparatus can also be disposed through the Faraday shield 108 near the central region, where the hole is provided. The probing apparatus can be provided to probe process parameters associated with the plasma processing system, during operation. Probing processes can include endpoint detection, plasma density measurements, ion density measurements, and other metric probing operations. The circular shape of the Faraday shield 108 is defined due to the geometry of a typical wafer, which is usually circular. As is well known, wafers typically are provided in various sizes, such as 200 mm, 300 mm, 450 mm, etc.

Disposed above the Faraday shield 108 is the dielectric window 104. As noted above, the dielectric window 104 can be defined from a quartz type material. Other dielectric materials are also possible, so long as they are capable of withstanding the conditions of a semiconductor etching chamber. Typically, chambers operate at elevated temperatures ranging between about 50 Celsius and about 160 Celsius. The temperature will depend on the etching process operation and specific recipe. The chamber 102 will also operate at vacuum conditions in the range of between about 1 m Torr (mT) and about 100 m Torr (mT). Although not shown, chamber 102 is typically coupled to facilities when installed in a clean room, or a fabrication facility. Facilities include plumbing that provide processing gases, vacuum, temperature control, and environmental particle control.

These facilities are coupled to chamber 102, when installed in the target fabrication facility. Additionally, chamber 102 may be coupled to a transfer chamber that will enable robotics to transfer semiconductor wafers into and out of chamber 102 using typical automation.

Continuing with reference to FIG. 1, the TCP coil is shown to include an inner coil (IC) 122, and an outer coil (OC) 120. The TCP coil is placed and arranged over the dielectric window 104, which is respectively placed over the Faraday shield 108. In one embodiment, match components 128 and RF generators 126 are provided, as coupled to the coils. In one embodiment, the chamber will be connected to a controller that is connected to the electronics panel of chamber 102. The electronics panel can be coupled to networking systems that will operate specific processing routines that depend on the processing operations desired during specific cycles. The electronics panel can therefore control the etching operations performed in chamber 102, as well as control the delivery and removal of fluid to a hub, when air cooling the Faraday shield 108.

Figure 2A:
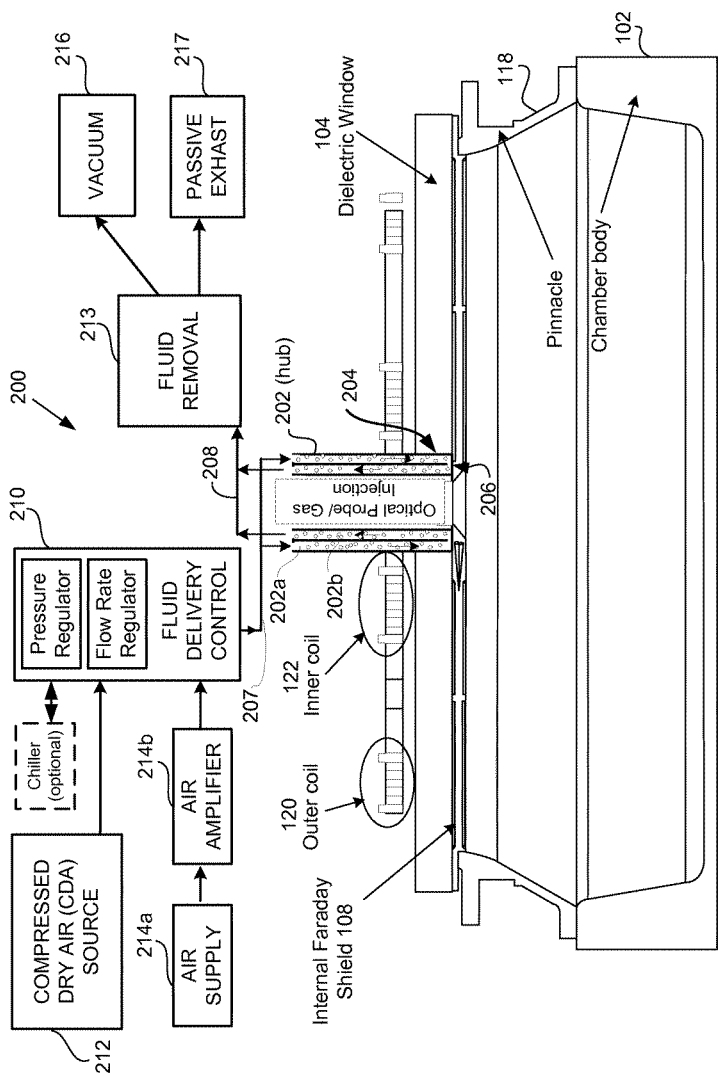
FIG. 2A illustrates a portion of a chamber used in plasma processing, having a Faraday shield interfaced with a hub for conducting heat away from the Faraday shield from outside of a processing volume, in accordance with one embodiment of the present invention.

FIG. 2A shows a system diagram 200, of a hub 202 that is used to air cool Faraday shield 108, in accordance with one embodiment of the present invention. In this example, the hub 202 is a structure that couples to the Faraday shield 108 and fits into an opening of the dielectric window 104. This configuration allows hub 102 to provide air cooling transfer to both the Faraday shield 108 and the dielectric window 104. For instance, the hub 102 has exterior surfaces that are placed in contact with surfaces of the Faraday shield 108 and the window 104.

As shown, an interface 204 is provided between the hub and window interface. An interface 206 is provided between the hub and Faraday shield 108. Broadly speaking, the surfaces of the hub 102 are placed in contact with the surfaces of the Faraday shield 108, and optionally also with the dielectric window 104. The contact, in one embodiment is thermal contact. For instance, if the surfaces are placed adjacent to each other, closer placement will provide better thermal interconnection, while direct physical contact will provide better thermal interconnection. In one embodiment, the thermal interconnection is designed such that the interface 206 with the hub 202 is in direct physical contact with the Faraday shield 108.

In one embodiment, the hub 202 will include a plurality of input conduits 202a and output conduits 202b, which are connected to connection lines 207 and 208, respectively. The connection line 207 couples to fluid delivery control 210. Fluid delivery control 210 receives fluid from a compressed dry air (CDA) source 212, or an air supply 214a that is coupled to an air amplifier 214b. In one embodiment, the controller can define which input the fluid delivery control 210 will select. In another embodiment, fluid delivery control 210 is connected via plumbing or facilities lines or tubes, that use CDA 212 or the air supply/air amplifier 214.

In one configuration, fluid delivery control 210 uses fluid flows that are selected to have a particular flow rate. In one embodiment, the plenum of the hub defines a loop into and out of the hub, such that the flow of fluid is maintained outside of the processing volume. That is, no fluid passed through the hub will enter the sealed processing volume that is under pressure and filled with processing gas during operation. Further, the flow of fluid provides for a reduced temperature at the center region of the Faraday shield, and the reduced temperature in the center region induces a conductive flow of heat through the Faraday shield toward the center region.

Flow rates that are believed useful for cooling the Faraday shield 108 can range between 0.5 CFM (cubic feet per minute) to 20 CFM. In experimental testing, flow rates tested include 1 CFM, 5 CFM, and 10 CFM, although higher flow rates are believed to be possible. As will be discussed below, sufficient cooling was observed when flow rates of 5 CFM and 10 CFM were used. If CDA 212 is used, the compressed nature of CDA 212 will cause the flow to reach flow rates of 1-10 CFM. If an air supply 214a is used, an air amplifier 214b is needed to produce flow rates between 0.5 CFM and 20 CFM. It is believed that even higher flow rates than 20 CFM may be useful, for instance up to 60 or 50 CFM.

In one embodiment, depending on the configuration of the Plenum used within the hub 202, the pressure at the input of the hub can vary. In a hub used for experimental testing, the pressures at the input of the hub were measured to be between 10 and 25 pounds per square inch (PSI). Much higher pressures can be used at the source, as the pressure may drop just before delivery to the hub input(s). For the experimental testing where 1 CFM was set, the PSI at the input was measured at 14.7 PSI, where 5 CFM was set, the PSI at the input was measured at 15.5 PSI, where 10 CFM was set, the PSI at the input was measured at 17 PSI.

It is believed that the flow of air into the Plenum of the hub 202 and out of the Plenum 22 provides for a circulation and/or communication of air that reduces or removes heat from within the hub 202. The hub 202, without the circulating air flow could increase in temperature matching or approximately matching the temperature of the Faraday shield 108, if placed in thermal contact with the Faraday shield 108. However, because the air flow into and out of the Plenum of the hub 202 reduces the heat within the Plenum, such as at the region of the interface between the hub and the Faraday shield 108, heat is removed.

Connection line 208 is coupled to a fluid removal control 213 that is connected to the output conduits 202b of the hub 202. Fluid removal control 213 can be coupled to vacuum 216 or a passive exhaust 217. In one embodiment, if vacuum 216 is used, fluid removal control 213 can pull on the fluid passing through the Plenum of the hub 202, which assists in expediting the flow of air provided by fluid delivery control 210. In the case of passive exhaust 217, the fluid removal control 213 simply removes the fluid (i.e. air) from the hub 202 and dispenses it appropriately within the facilities of the chamber clean room.

In one embodiment, the fluid delivery control 210 includes a flow rate regulator, and optionally includes a pressure regulator. In another embodiment, a flow regulator and/or the pressure regulator is/are separate components from the fluid delivery control 210. In one embodiment, a controller 240 can control one or more valves or communicates control data to the fluid delivery control to set or regulate the flow rate provided to the hub 202.

Although air is described to be the fluid used with hub 202, other fluids may also be used. For instance, liquids can also be used and channeled through hub 202. In still other embodiments, the fluids can be gases, such as nitrogen, helium, etc.

In other embodiments, the liquids or air can be cooled in advance, such that the fluid delivery control 210 provides the fluid at a reduced temperature.

In one embodiment, a system for use in a plasma processing chambers is provided. The system includes a disk structure defining the Faraday shield, and the disk structure has a process side and a back side. The disk structure extends between a center region to a periphery region (e.g., an area near or at the edge of the Faraday shield). The disk structure resides within the processing volume. The system also includes a hub 202 having an internal plenum for passing a flow of air received from an input conduit and removing the flow of air from an output conduit. The hub has an interface surface that is coupled to the back side of the disk structure (e.g., having a disk shape) at the center region.

A fluid delivery control 210 is coupled to the input conduit of the hub 202. The fluid delivery control is configured with a flow rate regulator. The regulated air can be amplified 214 or compressed dry air (CDA) 212. The system includes a fluid removal control 213 coupled to the output conduit for removing the flow of air from the plenum of the hub 202. The plenum of the hub defines a loop into and out of the hub, and that the flow of air is isolated from the processing volume. The loop can take on many configurations and paths. The loop can be simple in and out or can travers in nonlinear paths inside of the hub or in plenums formed in the Faraday shield (e.g., as shown in FIG. 3B below). A controller 240 is provided for managing the flow rate regulator that sets the flow rate of the flow of air.

Figure 2B:
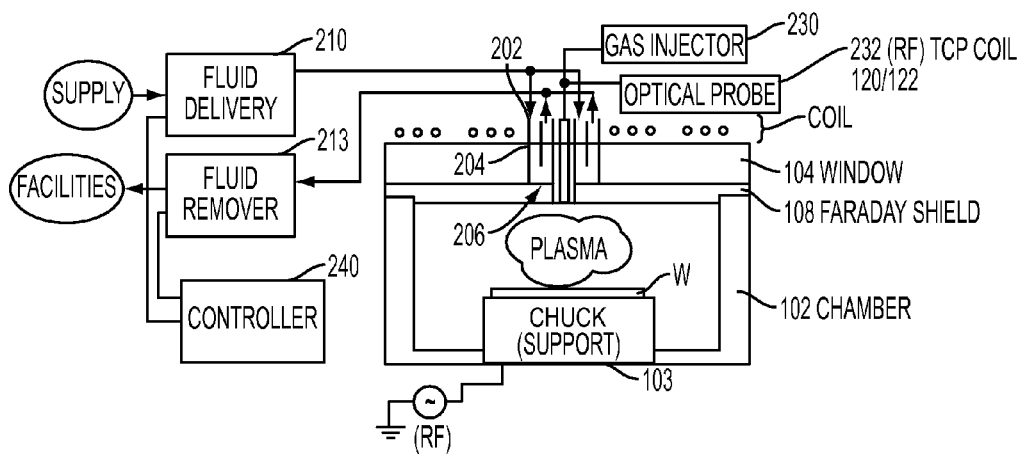
FIG. 2B illustrates another simplified example of a chamber having a hub and the interface surfaces of the hub for contacting the Faraday shield and optionally the dielectric window, in accordance with one embodiment of the present invention.

FIG. 2B illustrates an embodiment where the hub 202 is coupled to the Faraday shield 108 and the window 104, in accordance with one embodiment of the present invention. In this example, the coupling is thermal coupling. Thermal coupling means that the surface of the hub 202 is in physical contact with a surface of the Faraday shield 108 and or the window 104. For instance, the hub can be in physical contact at interface 204 and interface 206, with the window 104 and Faraday shield 108, respectively. Thermal coupling simply means that the surfaces of the hub or air flow is in direct physical contact with the Faraday shield or window, or the hub is in close proximity (e.g., without physical contact or minimal contact) that its temperature can impact the temperature of an adjacent structure.

In one embodiment, the hub 202 is defined from a temperature conductive material. The temperature conductive material can be a metal. The metal can be aluminum, stainless steel, copper or combinations of metals and alloys that thermally conduct heat. In one embodiment, the surface interfaces of the hub 202 are configured or fabricated to provide even surface contact with the thermally conductive surfaces of the Faraday shield 108 and the window 104. Fabricating the surfaces can include, polishing the surfaces so that the surfaces mate and provide a thermal connection when placed in physical contact with one another. In other embodiments, glues or adhesives that thermally conduct can also be placed between the hub and the surfaces of the Faraday shield 108 and or the window 104.

In the illustration of FIG. 2B, the hub 202 includes a Plenum within the hub, such that fluids flow into the hub and flow out of the hub. As mentioned above, fluid delivery control 210 can deliver the fluids to the hub 202 and fluid removal control 213 can remove the fluids from the hub 202. Fluid delivery control 210 is coupled to supplies, such as facility supplies that can provide the correct fluid selected for the configuration or process. A controller 240 is shown communicating with a fluid delivery control 210 and the fluid removal control 213. Controller 240 is in communication with system electronics that may include an interface for controlling and setting recipes for use when processing wafers in chamber 102.

As mentioned above, the chamber 102 is used to process etching operations using plasma, which can etch features or surfaces or materials of the wafer, which is placed on a Chuck support 103. RF supplies are communicated and coupled to the Chuck support 103, and RF TCP coils 120/122 are disposed over the window 104 to provide power to the plasma of the chamber 102, during operation. Also shown is a gas injector 230 and an optical probe 232. The gas injector 230 and optical probe 232 are, in one embodiment disposed between a center region of the hub 202. The gas injector 230 is provided for injecting gas into the chamber during operation, and the optical probe 232 is provided to measure and provide endpoint detection of the processes occurring within the chamber during plasma processing.

In one embodiment, the gas injector is defined in a center cavity of the hub, and the gas injector is defined for providing process gas into the processing volume. In one embodiment, the optical probe is defined in a center cavity of the hub, and the optical probe is defined for monitoring process conditions in the processing volume during use. The center cavity may be tubular, square or other shapes. The center cavity extends through the Faraday shield 108 and the window. A seal is made between the gas injector in the hub, such that the process volume is closed to conditions outside of the chamber. The hub and its air supplies are external to the chamber, such that it hub is isolated from the processing volume.

Figure 2C:
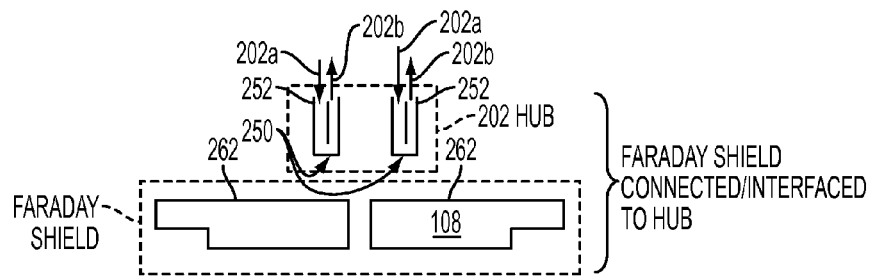
FIGS. 2C-2E illustrate exemplary alternative interfaces or constructions of the hub and/or the hub and Faraday shield, in accordance with one embodiment of the present invention.

FIG. 2C illustrates an example where the hub 202 is separate from the Faraday shield 108. In this embodiment, the hub 202 is configured to be placed in physical contact with the Faraday shield 108. The physical contact will be such that the bottom interface surfaces 250 of the hub 202 will contact an interface surface 262 of the Faraday shield 108. In other embodiments, the side interface surfaces 252 of the hub 202 can also be placed adjacent to other surfaces, such as the window 104, as shown in FIG. 2B. As such, the hub 202 can be assembled and connected to the Faraday shield 108 using any connection means, such as screws, clamps, surface indentations, clips, glue, adhesives, or combinations thereof.

Figure 2D:
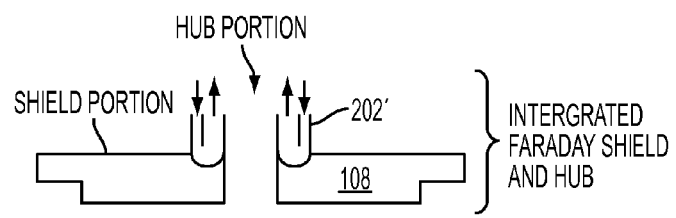

FIG. 2D illustrates an example where an alternative hub 202' is provided, in accordance with another embodiment of the present invention. In this embodiment, the hub 202' is integrated with the Faraday shield 108. The integrated construction allows for the hub to be at least partially disposed within the surface or body of the Faraday shield 108. That is, the hub portion is allowed to be unified with the shield portion, such that the Plenum is allowed to communicate air for cooling of the Faraday shield 108 into the body of the Faraday shield 108. The side interface surfaces 252 of FIG. 2C can also operate as the side surfaces of the hub portion in FIG. 2D.

Figure 2E:
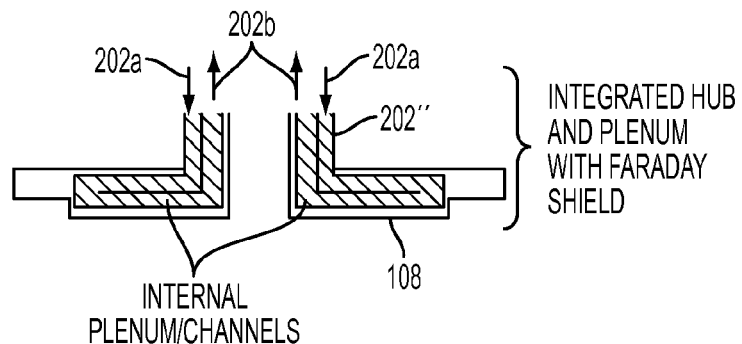

FIG. 2E illustrates an example where a hub 202" is provided in accordance with another embodiment of the present invention. In this example, the hub 202" includes a Plenum that is integrated and extended with in the body of the Faraday shield 108. As the Faraday shield has a plurality of fins, it is possible that certain ones of the fins can include a cavity or cavities that can define an internal Plenum or channels to allow for the air flow to cool the internal surfaces of the Faraday shield 108. In this implementation, the window 104, if placed proximate or on top of the Faraday shield 108 can also benefit from the cooled Faraday shield 108. Accordingly, it should be appreciated that the hub 202 can take on any number of configurations so long as an air flow can be provided to the hub and the airflow is used to remove heat from the hub, which is in physical contact or integration with the Faraday shield 108.

Figure 2F:
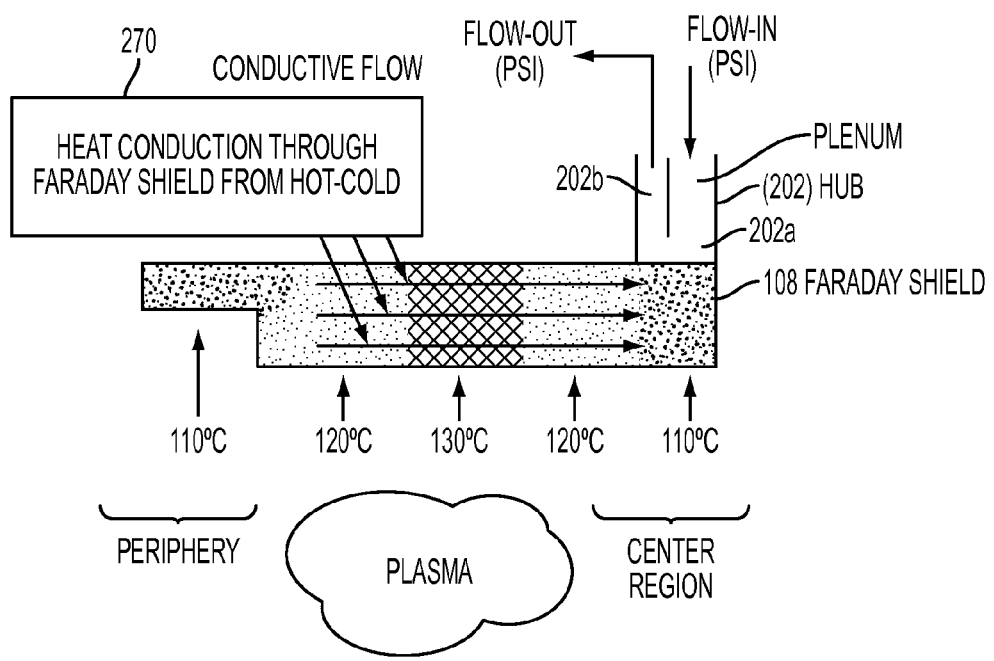
FIG. 2F illustrates a graphical representation of heat conductance through a body of the Faraday shield toward the center region of the Faraday shield, in accordance with one embodiment of the present invention.

FIG. 2F illustrates an example where the Faraday shield 108 is undergoing a cooling operation by way of the airflow into and out of the hub 202, in accordance with one embodiment of the present invention. As illustrated, the Faraday shield 108 can take on a temperature gradient which varies based on a number of factors. The factors can include the placement of the coils above the Faraday shield, as well as heat generated within the chamber during plasma processing. In this example, it is illustrated that the center region of the Faraday shield 108 has a cooler condition of about 110° C., and the peripheral edge also has a cooler condition of about 110° C. Between the periphery of the Faraday shield 108 and the center region, the temperatures can be detected to be about 130° C., surrounded by about 120° C.

By applying the airflow to the hub 202, heat conduction 270 occurs through the Faraday shield from hot to cold. The arrows drawn across the Faraday shield 108 indicate the direction of heat conduction or conductive flow of heat across the Faraday shield 108. The conductive flow of heat will be from hotter regions to the cooler regions, or in the illustrated example, from the periphery to the center region of the Faraday shield 108. Without providing the flow of air for cooling to the hub 202 which contacts the Faraday shield 108 in the center region, the temperature in the center region, in experiments, was measured to be at approximately 140° C. However, by providing the cooling by airflow through the hub 202, the resulting temperature distribution shown in FIG. 2F was observed and measured. FIG. 5B-2, below, will illustrate the temperature ranges observed and measured of the Faraday shield 108 without cooling and with cooling provided by different flow rates through the hub 202.

FIG. 3A illustrates an example of a Faraday shield 108 structure, which would face the window 104. FIG. 3B illustrates a modification to the center region of the Faraday shield 108. The modification to the center region of the Faraday shield 108 can include a recess for defining part of the Plenum established when hub 202 shown in FIGS. 3C and 3D are connected to the Faraday shield 108. Therefore, the hub 202 shown in FIGS. 3C and 3D will have an open bottom and that mates to an airflow Plenum 302 formed in the center region of the Faraday shield 108.

The hub 202 will therefore have an interface surface 262 where the interface surface 250 of the hub 202 will mate and connect. The meeting and connecting functions as physical contact between the Faraday shield 108 and the hub 250, such that the heat conducts between the hub 202 and Faraday shield 108 in the center region. The Faraday shield 108, in one embodiment, is also defined from a metallic material. The material is such that heat conducts through and along the Faraday shield 108 and interfaces with the metallic material of the hub 202. As shown in FIG. 3C, the hub 202 will mate with the center region of the Faraday shield 108, such that the interface surface 250 couples to the interface surface 262.

FIG. 3D illustrates one example, where the inputs into the hub 202 will traverse as channels down the sidewalls of the hub 202 toward the base of the hub 202 where the interface is made with the Faraday shield 108. The air will then circulate in the grooves of the air Plenum 302 of the Faraday shield 108 and then out of one of the channels within the hub 102. Therefore, one or more input conduits 202a can be connected to the hub 202 for delivery of fluid and one or more output conduits 202b can be connected to the hub 202 for removal of fluid.

The constructions of hub 202 shown in FIGS. 3C and 3D are only exemplary in nature, and other constructions are possible so long as air can be flown into the hub 202 and removed from hub 202 to provide a continuous flow of air at a flow rate for removal of heat from the center region of the Faraday shield 108.

Figure 4A:
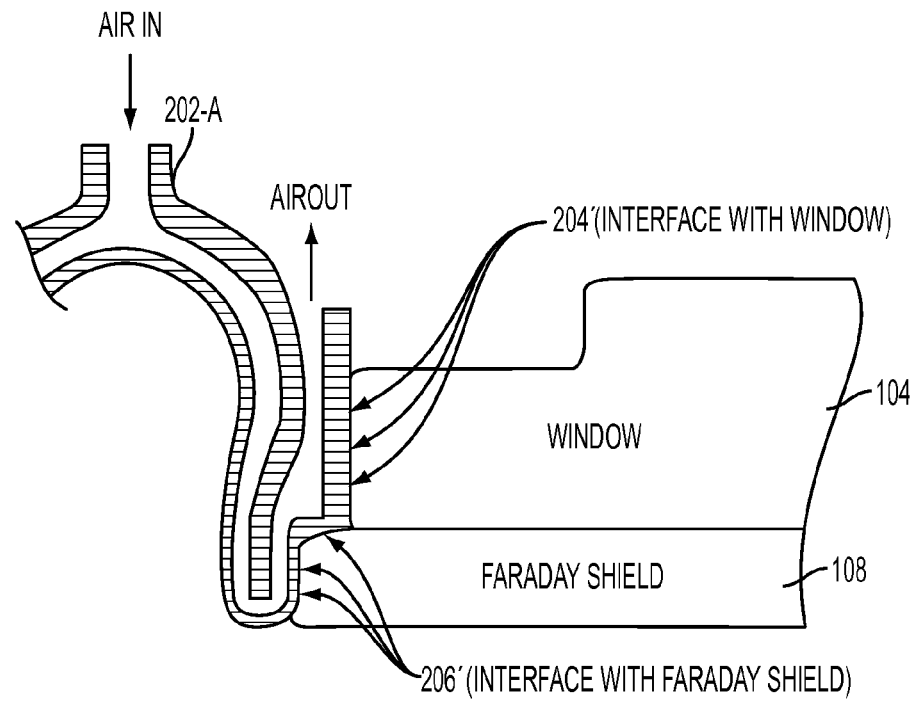
FIGS. 4A-4B illustrate still another alternate hub construction, and interface surfaces to the dielectric window in addition to interfaces with the Faraday shield, in accordance with one embodiment of the present invention.

FIG. 4A illustrates another example of a hub 202-A with a single input air conduit, in accordance with one embodiment of the present invention. In this embodiment, air is flown into the single input which distributes the air circularly within a Plenum of the structure of hub 202-A. The air is caused to flow in and out of the hub 202-A, such that the temperature at the interface with the window 204' and the interface with the Faraday shield 206' is reduced. In one embodiment, the hub 202-A is made of a conductive material such that can conduct between the hub 202-A and the window 104 and the Faraday shield 108. In this example construction, the hub 202-A has a curved step that allows contact between both the Faraday shield 108 and the window 104.

Figure 4B:
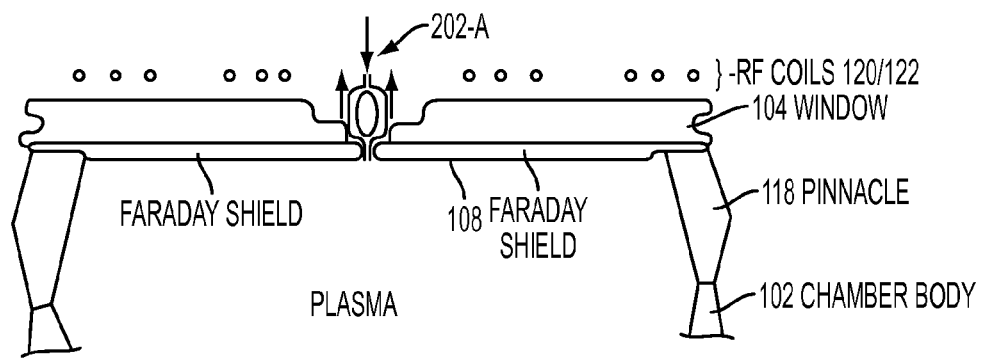

The curved step construction also allows for security placement within the center region of the window 104 and provides the contact with the Faraday shield 108, as shown in FIG. 4B. Again, the exemplary construction of the hub 202-A was only provided to illustrate the flexibility and many configurations that a hub can take, so long as contact is made between some of the surfaces of the hub and the Faraday shield 108, or both the Faraday shield 108 and window 104. In another embodiment, the hub can simply contact only the window 104 and not the Faraday shield 108, or only the Faraday shield 108 and not the window 104.

Figures 1, 5A:
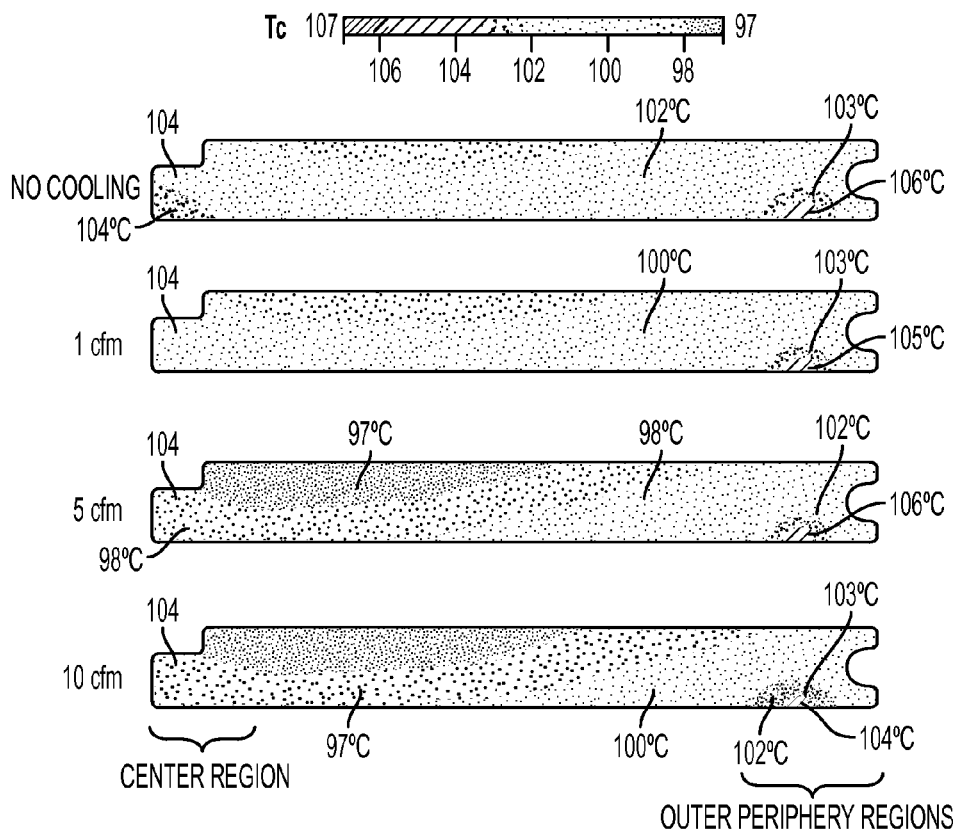
Figures 2, 5A:
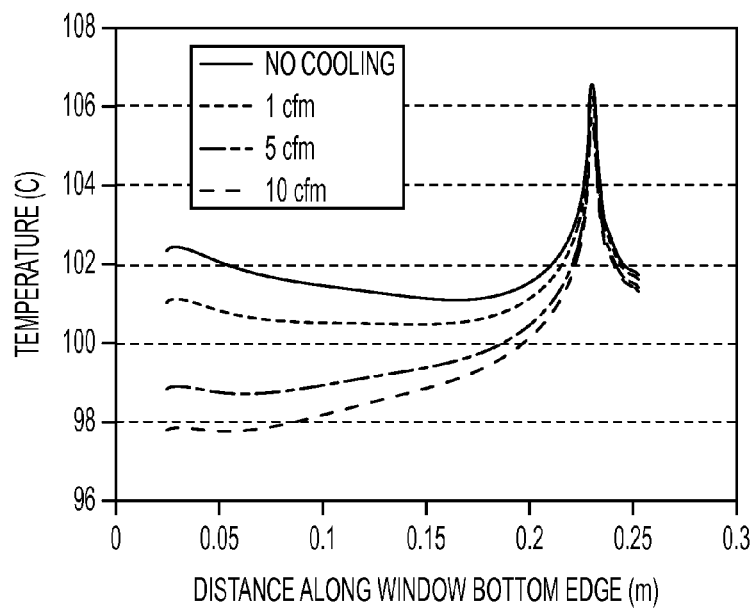
Figures 1, 5B:
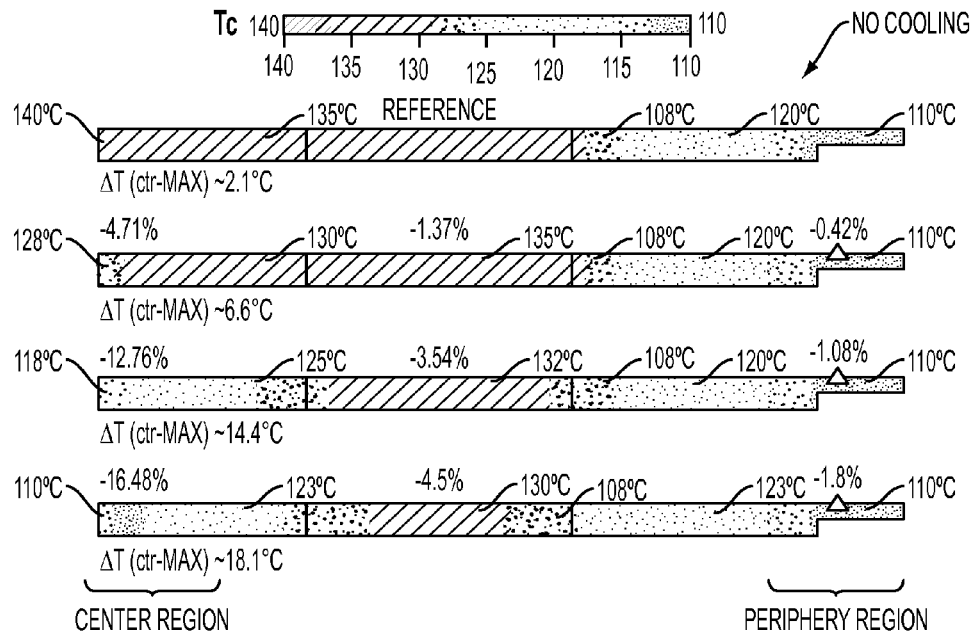
Figures 2, 5B:
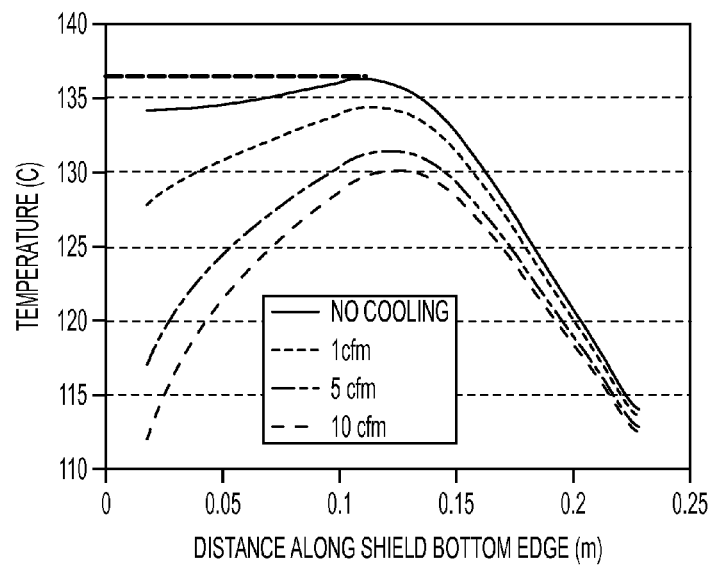

FIG. 5A-1 illustrates an example of the temperature gradients observed by the window 104 under several conditions of cooling or no cooling, in accordance with one embodiment of the present invention. The window 104 shown in FIG. 5A-1 represents a cross-sectional half of the window, for purposes of illustration only. The left side of each window 104 is approximately the center region of the window 104, which is configured to be placed over the Faraday shield 108. The rightmost section of the window 104 segment is considered to be the outer periphery of the window 104.

In FIG. 5A-2, a number of flow rate settings for air flow through the hub 202 is shown, for comparison purposes. For example, conditions are shown for no cooling, which means no air flow through the hub 202. An example is shown for a flow rate of 1 CFM which impacts the temperature of the window closest to the center region initially, and as the center region cools by way of the air traveling through the hub 202, heat conducts away from the periphery of the window 104 toward the center region, thus reducing the temperature of the window 104. An example is shown for a flow rate of 5 CFM which also impacts the window closest to the center region initially, and as the center region cools by way of the air flow through the hub 202. An example is also shown for 10 CFM which in the experiment provides a larger impact on heat reduction of the window 104.

Although the heat reduction initially occurs near the center region of the window, which would be proximate to the hub 202 that may be in contact with the window or simply in contact with the Faraday shield 108, a steady-state will eventually occur during processing. The steady-state will be when continuous airflow at the chosen CFM level is set, and processing continues over a period of time. During this processing over the period of time, the window can be made to remain at steady-state, such as at the temperature distribution shown when a particular CFM level is continuously applied through the hub 202.

In other embodiments, a controller can be set when airflow is desired through the hub 202. For instance, no airflow could be selected during cycle times when the processing is stopped or progresses, and airflow can resume or increase at different rates and remain at particular settings during specific process conditions. In this manner, the window can be made to avoid cycling through set temperature changes/differences, e.g., transitions of very hot to cold or from cold to very hot. In other examples, the system can control that the temperature differences are not more than 5 degrees in temperature difference, not more than 10 degrees in temperature difference, not more than 15 degrees in temperature difference, not more than 20 degrees in temperature difference, or any other setting. In other words, by controlling when the airflow is provided to the hub 202, it is possible to reduce the swings in temperature during process operations in accordance with specific recipes executed through the chamber.

Reductions in swings of temperature variations can assure or reduce the risk of having polymer buildup on the inside of the Faraday shield 108 facing the wafer from flaking polymer onto the surface of the wafer being processed. Further, simply having elevated temperatures on the Faraday shield can damage the Faraday shield coatings, such as anodized coatings. These coatings may flake off or peel off at elevated temperatures, if the Faraday shield remains at such elevated temperatures, such as above 135° C. for extended periods of time or if such elevated temperatures are used the lifetime of the Faraday shield may be reduced. It is believed that maintaining the temperature of the Faraday shield 108 at some constant or within some controlled temperature variation not exceeding some predefined temperature differential, material from polymer byproducts adhered to the Faraday shield 108 will remain adhered until a next cleaning operation is performed.

FIG. 5B-1 illustrates an example of the temperature effects of having the Faraday shield 108 in thermal contact with the hub 202, in a location proximate to the center region of the Faraday shield 108. In this illustration, half of a cross section of Faraday shield 108 is shown, where the leftmost portion is the portion that is closest to the center region and the rightmost portion is the portion that is near the peripheral region of the Faraday shield 108. As illustrated, the top Faraday shield 108 is provided with no cooling. No cooling means that either the hub 202 is not connected or interfaced with the Faraday shield 108 or no airflow is provided to the hub 202. For instance, the center region of the Faraday shield with no cooling may reach a temperature near about 140° C. When an airflow of about 10 CFM is applied to the hub 202, the center region of the Faraday shield can be shown to reach a lower temperature of about 110° C. At the same 10 CFM, the center region is shown to reach a temperature of about 130° C.

The graph shown in FIG. 5B-2 illustrates the various impacts of different flow rates, such as 10 CFM, 5 CFM, 1 CFM and no cooling. As discussed above, it is believed that by applying the hub in physical contact with the Faraday shield 108 or providing a hub that allows a Plenum within the hub to flow a fluid/air to the Faraday shield 108 near the center region, the center region of the Faraday shield 108 will reduce in temperature. This reduction in temperature near the Faraday shield center region will cause a conduction of heat from regions of the Faraday shield 108 that are hotter than the region near the center region where the hub is providing the airflow. Although temperature will still vary across the length of the Faraday shield segment shown in FIG. 5B-1, as confirmed by experiment, it is possible to approximate what the temperature will be across the Faraday shield surface for different flow rates of air.

Nevertheless, the experimental data confirms that increase flow rates assist in reducing the temperature near the center region of the Faraday shield which also assist in bringing down the temperature between the center region and peripheral region. For example, the graph of FIG. 5B-2 shows that the region between the center region and the peripheral region can be decreased from a temperature that is over 135° C. down to a temperature that is approximately 130° C. when approximately 10 CFM flow rate is provided to the hub 202, which is in contact or thermal contact with the Faraday shield 108.

Figures 6A, 6B:
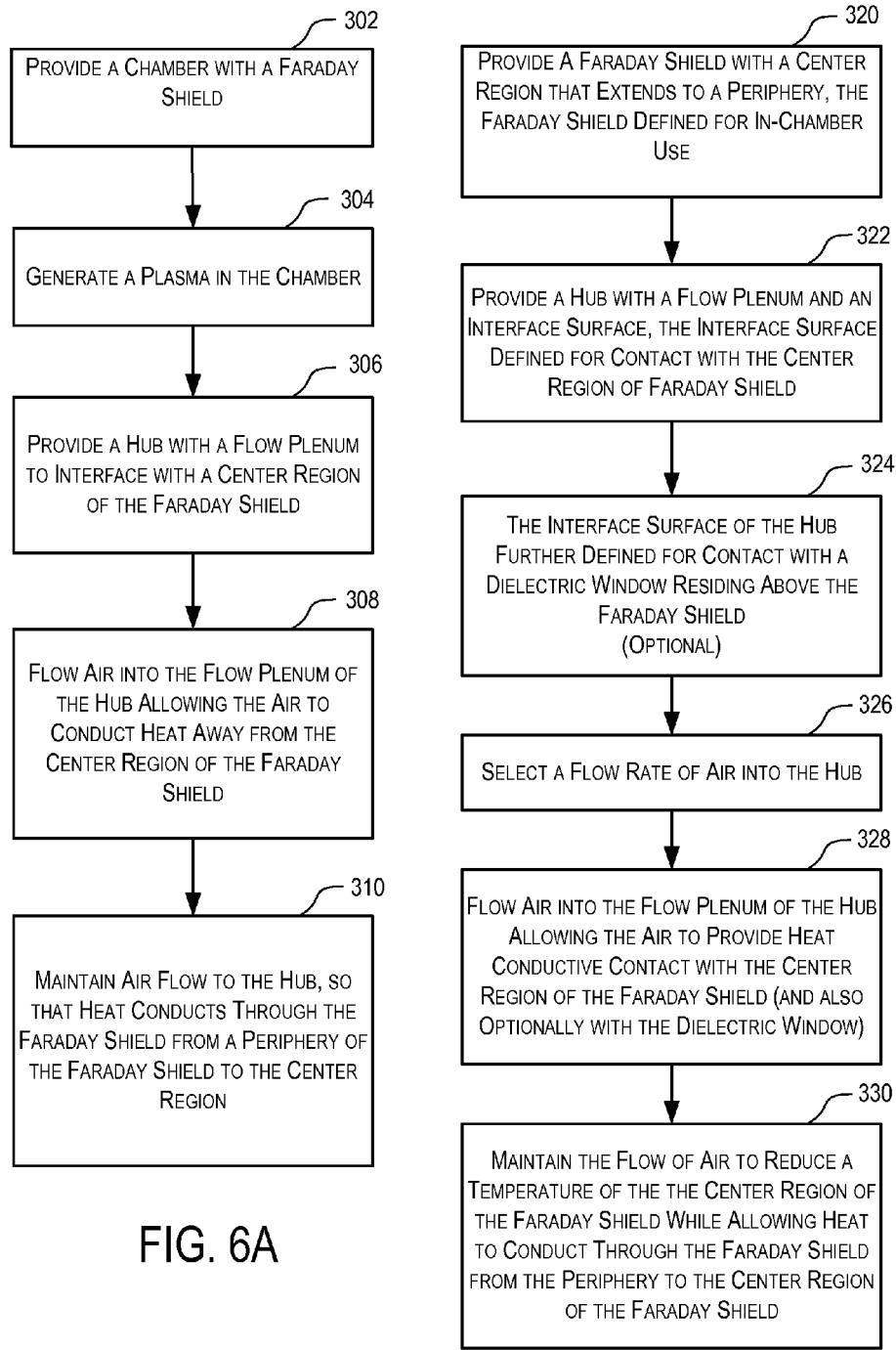
FIGS. 6A and 6B illustrate example method operations for using a Faraday shield with a hub for air cooling of the center region of the Faraday shield to cause heat conductance out of the Faraday shield from outside of the processing volume, in accordance with one embodiment of the present invention.

FIG. 6A illustrates one flow of method operations that may be utilized to operate a plasma chamber that uses a hub for providing a flow of air for cooling a Faraday shield, in accordance with one embodiment of the present invention. In operation 302, a chamber with a Faraday shield is provided. The chamber is used for processing semiconductor wafers, and in particular use for etching operations. The Faraday shield is provided in a configuration that faces the processing wafer within the chamber. In operation 304, a plasma is generated in the chamber. The plasma is generated utilizing gases that are configured and selected for etching particular surfaces on semiconductor wafers during fabrication. The gases are then excited utilizing power provided by RF power delivery systems. The gases, under pressure, are then converted into a plasma using the power, such as RF power provided by the TCP coils and or power provided to the chuck on which the wafer sits or is placed during operation.

In operation 306, a hub is provided with a flow Plenum and is interfaced with a center region of a Faraday shield. The interfacing with the Faraday shield is such that thermal conductivity can take place between the Plenum of the hub and a surface of the Faraday shield in contact with the hub or channels that enable flow of air or fluids through the hub so as to thermally conduct with the Faraday shield. The flow of air provided to the hub and the Plenum of the hub enable the flow of air to conduct heat away from the center of the Faraday shield, by allowing heat to transfer and conduct through the Faraday shield from the periphery of the Faraday shield to the center region of the Faraday shield closest to the hub, where airflow is provided.

In operation 310, the airflow can be maintained to the hub, so that the heat conducts through the Faraday shield from the periphery of the Faraday shield to the center region. Maintaining the airflow can be controlled by a controller of the chamber setting of when the airflow is conducted, and the level of airflow can be set based on a recipe. The recipe can be associated to a processing recipe utilized for etching wafers. The processing recipe can identify periods of time when the airflow will be provided, and the flow rates at which the airflow will be provided through the hub so as to maintain the temperature desired at the center region, and the resulting temperature gradients across the Faraday shield.

FIG. 6B illustrates another embodiment of utilizing a hub for air cooling a Faraday shield. In 320, a Faraday shield is provided with a center region that extends to a periphery. The Faraday shield is defined for use in the chamber, such that the Faraday shield is exposed to the plasma produced in the plasma etching chamber. In operation 322, a hub with a flow Plenum is provided. The hub is configured to interface via an interface surface with a center region of the Faraday shield. In operation 324, an interface surface of the hub can also be defined to contact a dielectric window that may be residing above the Faraday shield. Having the hub contact the dielectric window is optional.

In operation 326, a flow rate of air into the hub is selected. The flow rate can be selected for a period of time, based on a recipe, or at the control of the user during operation, or adjusted from time to time. It is believed that a higher flow rate will increase the ability to reduce the temperature of the Faraday shield near the center region, and can also impact a reduced temperature of the Faraday shield toward the periphery.

In operation 328, air is flown into the flow Plenum of the hub allowing the air to provide heat conductive contact with the center region of the Faraday shield, and optionally with the dielectric window. Again, the flow of air can be managed and set based on a predefined recipe. The predefined recipe can be adjusted or correlated to the plasma etching recipe utilized for one or more wafers. In operation 330, the flow rates of air can be maintained to reduce a temperature of the center region of the Faraday shield. This will allow heat to conduct through the Faraday shield from the periphery toward the center region of the Faraday shield.

As described above, one embodiment utilizes compressed dry air to cool an internal Faraday shield. However, it is believed that using a higher airflow of air, and not necessarily the fact that it is compressed dry air, will assist in reducing the temperature of the Faraday shield where the higher airflow is provided via a hub or structure. The "central air delivery hub" which mates to the center section of an internal Faraday shield therefore enables the delivery of the higher airflows, which can reduce the temperature of the Faraday shield. It is through this hub that the air comes into contact with the Faraday shield and thus allows cooling of said shield. It should be noted that the air flow does not actually go into the chamber, it just circulates around the hub or is provided in close proximity to the Faraday shield via the hub.

The hub and its Plenum reside outside of the chamber, and no airflow is provided into the chamber to assist in the cooling. And, heat transfer out of the Faraday shield occurs via conduction. That is, the air flow cools the center of the shield such that heat is conducted through the shield itself from the edge/middle of the shield. The airflow does not directly remove heat from the edge/center of the shield via conduction. Thus, the higher airflow assist in providing a higher heat transfer rate by conduction through the Faraday shield toward the cooler center region where the airflow is provided.

In some embodiments, a chiller is provided to cool the fluid before being provided to the hub 202. In this manner, the fluids coupled to a chiller reduce a temperature of the fluids before delivery by the fluid delivery control. A chiller may include a refrigerant system that cools supply lines or flows fluids or gases to transfer cold temperatures to lines or supplies. The chiller can be a jacket around supply lines coming to or leaving the fluid supply control 210. The chiller may cool the air as low as −50 degrees C., or lower. In other embodiments, the chiller will just cool the air/fluid to just above freezing.

It should be understood, however, that the simple flow of air and increasing the flow rate of air at room temperature 20 degrees C. (i.e., without chilling) will function to induce or start the conduction of heat out of the Faraday shield using the hub.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A plasma processing apparatus, comprising:
a chamber having walls and a substrate support defined in a processing volume;
a Faraday shield having a disk shape with a process side and a back side, the disk shape extending between a center region to a periphery region, the Faraday shield defined within the processing volume, such that the process side faces the substrate support;
a dielectric window disposed over the Faraday shield, the dielectric window having a center opening;
coils for supplying radio frequency (RF) power disposed over the dielectric window;
a hub having an internal plenum for passing a flow of fluid received from an input conduit and removing the flow of fluid from an output conduit, the hub having sidewalls and a center cavity inside of the sidewalls for an optical probe, the internal plenum is disposed in the sidewalls, the hub having an interface surface that is in physical contact with the back side of the Faraday shield, the physical contact provides for a thermal coupled to said Faraday shield at the center region, and wherein an outer surface of the sidewalls of the hub are disposed within the center opening of the dielectric window and the coils are oriented around the sidewalls of the hub above the dielectric window, said sidewalls of the hub further providing thermal couple to a region of the dielectric window proximate to the center opening;
a fluid delivery control coupled to the input conduit of the hub, the fluid delivery control is configured with a flow rate regulator for setting a flow rate of the flow of fluid through the plenum of the hub; and
a fluid removal control coupled to the output conduit for removing the flow of fluid from the plenum of the hub.

2. The plasma processing apparatus of claim 1, wherein the coils are transformer coupled plasma (TCP) coils.

3. The plasma processing apparatus of claim 1, wherein the plenum of the hub defines a loop into and out of the hub, such that the flow of fluid is maintained outside of the processing volume.

4. The plasma processing apparatus of claim 1, wherein the flow of fluid provides for a reduced temperature at the center region of the Faraday shield, the reduced temperature in the center region induces a conductive flow of heat through the Faraday shield toward the center region.

5. The plasma processing apparatus of claim 4, wherein the plenum of the hub defines a loop into and out of the hub, such that the flow of fluid is maintained outside of the processing volume.

6. The plasma processing apparatus of claim 1, wherein the center region in the back side of the Faraday shield includes a plenum that mates with the plenum of the hub, such that the interface surface of the hub surrounds the plenum of the Faraday shield, wherein the thermal couple to the back side of the Faraday shield is defined at the interface surface and via the flow of fluid passing through the hub.

7. The plasma processing apparatus of claim 6, wherein the plenum of the hub and the plenum of the Faraday shield define a loop into and out of the hub, and the fluid flow is maintained outside of the processing volume.

8. The plasma processing apparatus of claim 1, further comprising,
a gas injector defined in a center cavity of the hub, the gas injector defined for providing process gas into the processing volume.

9. The plasma processing apparatus of claim 1, wherein the optical probe is defined for monitoring process conditions in the processing volume during use.

10. The plasma processing apparatus of claim 1, wherein the fluid delivery control delivers fluids selected from air, gases, liquids, or mixtures thereof.

11. The plasma processing apparatus of claim 1, wherein the fluids are coupled to a chiller for reducing a temperature of the fluids before delivery by the fluid delivery control.

12. The plasma processing apparatus of claim 1, further comprising, a compressed dry air (CDA) source coupled to the fluid delivery control.

13. The plasma processing apparatus of claim 1, further comprising,
an air supply and air amplifier coupled to the fluid delivery control.

14. The plasma processing apparatus of claim 1, further comprising,
a controller for managing the flow rate regulator of the fluid delivery control.

15. The plasma processing apparatus of claim 14, wherein the controller correlates the flow rate of the fluid delivery control to process operations to be executed by the plasma processing apparatus.

16. The plasma processing apparatus of claim 14, wherein the controller increases flow rate to increase temperature reductions in the center region of the Faraday shield, or reduces flow rate to reduce temperature reductions in the center region of the Faraday shield, wherein temperature reductions increase conductive heat flow within the Faraday shield in a direction toward the center region.

17. A plasma processing apparatus, comprising,
a disk structure defining a Faraday shield, the disk structure having a process side and a back side, the disk structure extending between a center region to a periphery region, the disk structure configured to reside within the processing volume of the plasma processing apparatus, such that the process side faces a substrate support within the processing volume;
a dielectric window disposed over the Faraday shield, the dielectric window having a center opening;
coils for supplying radio frequency (RF) power disposed over the dielectric window;
a hub having an internal plenum for passing a flow of air received from an input conduit and removing the flow of air from an output conduit, the hub having an interface surface that is in physical contact to the back side of the disk structure at the center region, the hub having sidewalls, the internal plenum is disposed in the sidewalls and the sidewalls of the hub are configured to fit within the center opening of the dielectric window and extend to the center region of the disk structure of the Faraday shield, the coils are oriented around the sidewalls of the hub above the dielectric window, wherein an outer surface of said sidewalls of the hub further provide a thermal couple to a region of the dielectric window proximate to the center opening of the dielectric window;

a fluid delivery control coupled to the input conduit of the hub, the fluid delivery control configured with a flow rate regulator for setting a flow rate of the flow of air through the plenum of the hub; and a fluid removal control coupled to the output conduit for removing the flow of air from the plenum of the hub, wherein the plenum of the hub defines a loop into and out of the hub, and that the flow of air is isolated from the processing volume; and a controller for managing the flow rate regulator that sets the flow rate of the flow of air.

18. The plasma processing apparatus of claim 17, further comprising, a compressed dry air (CDA) source coupled to the fluid delivery control.

19. The plasma processing apparatus of claim 17, further comprising, an air supply and air amplifier coupled to the fluid delivery control.

20. The plasma processing apparatus of claim 17, further comprising, a chiller for adjusting a temperature of the air before delivery by the fluid delivery control.

21. The plasma processing apparatus of claim 17, wherein the interface surface of the hub defines the loop of the plenum.

* * * * *